(12) United States Patent
Akram

(10) Patent No.: US 6,404,048 B2
(45) Date of Patent: Jun. 11, 2002

(54) HEAT DISSIPATING MICROELECTRONIC PACKAGE

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/146,695

(22) Filed: Sep. 3, 1998

(51) Int. Cl.⁷ .................... H01L 23/48; H01L 29/40; H01L 23/02; H01K 7/20

(52) U.S. Cl. .......... 257/706; 257/712; 257/699; 257/684; 257/796; 257/713; 257/675; 257/717; 257/720; 361/719; 361/720; 174/252; 174/257

(58) Field of Search ................... 257/706, 712, 257/713, 717, 720, 796, 680, 675, 694, 684; 361/719, 720; 174/252, 257, 258

(56) References Cited

U.S. PATENT DOCUMENTS

| | | | |
|---|---|---|---|
| 4,374,316 A | * 2/1983 | Inemori | 219/209 |
| 4,420,203 A | * 12/1983 | Aug et al. | |
| 5,138,434 A | * 8/1992 | Wood et al. | 361/397 |
| 5,237,204 A | * 8/1993 | Val | 257/698 |
| 5,317,436 A | * 5/1994 | Sprtzer et al. | 359/83 |
| 5,323,297 A | * 6/1994 | Brzezinski | 361/689 |
| 5,397,921 A | * 3/1995 | Kornezos | 257/779 |
| 5,409,865 A | * 4/1995 | Karnezos | 257/707 |
| 5,578,869 A | * 11/1996 | Hoffman et al. | 257/691 |
| 5,583,377 A | * 12/1996 | Higgins, III | 257/707 |
| 5,615,224 A | * 3/1997 | Cohen | 257/718 |
| 5,629,835 A | * 5/1997 | Mahnliker et al. | 257/678 |
| 5,702,985 A | * 12/1997 | Burns | 257/693 |
| 5,710,695 A | * 1/1998 | Monteghi | 361/813 |
| 5,784,260 A | * 7/1998 | Fuller, Jr. et al. | 257/723 |
| 5,796,165 A | * 8/1998 | Yoshikawa et al. | 257/728 |
| 5,798,469 A | * 8/1998 | Nufer | 75/246 |
| 5,828,127 A | * 10/1998 | Yamagata et al. | 257/706 |
| 5,828,564 A | * 10/1998 | Mori et al. | 257/722 |
| 5,879,964 A | * 3/1999 | Park et al. | 438/113 |
| 5,901,046 A | * 5/1999 | Ohta et al. | 257/723 |
| 5,949,133 A | * 9/1999 | Wojnerzwski | 257/723 |
| 5,956,236 A | * 9/1999 | Corisis et al. | 257/723 |
| 5,977,633 A | * 11/1999 | Suzuki et al. | 257/738 |
| RE36,469 E | * 12/1999 | Wood et al. | 257/723 |
| 6,011,696 A | * 1/2000 | Mahajan et al. | 257/780 |
| 6,013,948 A | * 1/2000 | Akram et al. | 257/698 |
| 6,020,637 A | * 2/2000 | Kornezos | 257/738 |
| 6,028,358 A | * 2/2000 | Suzuki | 257/737 |
| 6,081,037 A | * 6/2000 | Lee et al. | 257/778 |
| 6,084,308 A | * 7/2000 | Kelker et al. | 257/777 |
| 6,114,048 A | * 9/2000 | Jech et al. | 257/720 |
| 6,133,634 A | * 10/2000 | Joshi | 257/738 |
| 6,166,434 A | * 12/2000 | Desai et al. | 257/704 |
| 6,201,301 B1 | * 3/2001 | Hoang | 257/712 |

* cited by examiner

Primary Examiner—Alexander O. Williams
(74) Attorney, Agent, or Firm—Workman, Nydegger & Seeley

(57) ABSTRACT

A novel package comprising a die and metal housing arrangement is provided that improves conduction of heat away from the die during use. The housing is a heat block and is abutted against the die in a thermally conductive manner. The heat block has a large thermal mass as compared to the die and is substantially rectangular in cross section. A cavity is formed in the heat block for receiving the die. In one embodiment, the cavity is substantially rectangular in cross section and is bound on three sides by a wall and open on the fourth side. In another embodiment, the cavity is substantially rectangular and bound on all four sides by a wall. In both embodiments, the cavity is slightly larger than the perimeter of the die and the walls are arranged to be in close proximity with the die during use. A metal lid is provided for at least partially covering the die and for thermally conductively attaching to the die to even further facilitate heat transfer. The lid either has holes or is solid to, respectively, allow an electrical lead frame to pass through or underneath the lid. A metal socket is provided to align the package to a circuit by matingly receiving the lead frame in a channel. The channel either allows direct passage therethrough of the lead frame or is electrically coupled to a socket pin. The socket may be configured with a plurality of heat sinks that thermally conductively contact the socket and the heat block of the package.

38 Claims, 4 Drawing Sheets

HEAT DISSIPATING MICROELECTRONIC PACKAGE

BACKGROUND OF THE INVENTION

1. The Field of the Invention

The present invention relates generally to the dissipation of heat from packaged die. More specifically the present invention relates to a novel package having a highly thermally conductive housing that improves the removal of heat generated by a die during use.

2. The Relevant Technology

Energized circuits consume electric power and convert that power into other forms of energy. Such other forms include sound energy, electromagnetic radiation and chemical energy. The most common conversion is that of electric power into heat through some form of resistance. Sometimes this heat is generated on an almost continuous basis such as with circuits using bipolar devices. Other times this heat is generated intermittently such as with CMOS devices which only generate heat in proportion to their operating frequencies.

Whether continuous or intermittent, electric power lost to heat in electrical devices sometimes serves a useful purpose, such as in a toaster or a hair dryer. Most times, however, heat generation is unintended and causes significant problems. Some problems are subtle, like modifications in the operating characteristics of the components such as reductions in speed and variations in temperature coefficients. Yet, some problems are more obvious, like mechanical failure of components due to explosion, melting or mismatches that occur in their coefficients of thermal expansion. In either instance, these heat related problems adversely impact upon the failure rates of components and severely shorten the lifetime of any circuits using them.

Instead of improving, heat related problems are worsening. In part, this is because of the ongoing quest for higher concentrations of circuits in the same or smaller sized areas. This higher concentration or density of circuits per unit area is best exemplified in ever-evolving devices such as supercomputers, hand-held devices, consumer electronics and minicomputers. With this evolution, however, not only is the physical size of the circuit decreasing but so too is the physical size of the internal components. This leads to the generation of even more heat.

In general, heat is removed from circuits and components by either active or passive means. Active means include, but are not limited to, forced air fans and circulating liquids like water and boiling fluids. Although the active means are effective at removing heat, they have limitations. One limitation is the expense in design, manufacturing and implementation. Another limitation is complexity. For example, circuits using forced air fans must have adequate space for the fan housing, which is typically much larger than the components of the circuit. These circuits must also have the fan positioned to best remove the heat which requires extensive pre-manufacturing analysis.

Passive means of heat removal include, but are not limited to, layout designs to allow for improved ventilation and heat sinks. Heat sinks, however, are problematic because of their typically enormous fin size in comparison to the components generating the heat. In turn, this causes circuits to maintain a large physical space which is adverse to the continual trend of miniaturization and downsizing. Moreover, heat sinks often vary in their shape from component to component. This variation causes problems when replacing worn components because circuits are not designed to adjust to each of the various heat sink shapes.

Still other heat removal means are taught in the prior art. In U.S. Pat. No. 5,702,985 issued to Burns, heat removal is taught by reducing the thickness of a die and the materials between the die and a heat conductive lead frame. Although this method tends to create a more streamlined package, this method relies exclusively on reducing component thicknesses within the package. This disadvantageously requires unique sized internal components to be manufactured and cannot easily find compatibility with other internal components.

Burns also teaches a ceramic housing for these components. Although ceramics are better thermal conductors than plastics, ceramics generally do not equal the thermal conductivity characteristics of pure metals and metal alloys. Therefore, Burns necessarily relies on a component other than the housing to ultimately conduct heat away from the die during use. In particular, the metal lead frame is used.

Although some prior art packages use metal as a housing, the die within the housing is typically thermally insulated from the metal by molding compounds. As such, the metal is used primarily as a barrier against mechanical and environmental problems such as vibration, electromagnetic radiation and moisture.

Accordingly, it is desirous to improve the removal of heat from a packaged die by employing the best known thermal conductors while still allowing for improvements in miniaturization, replacement conformity and costs.

SUMMARY OF THE INVENTION

In accordance with the invention as embodied and broadly described herein, a novel die package is provided by a semiconductive substrate having a plurality of electrical circuits fabricated on a circuit side thereof and having an opposite backside thereof.

In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The term semiconductor substrate is contemplated to include such structures as silicon-on-insulator, silicon-on-sapphire, gallium arsenide (GaAs), and Germanium.

A heat block also provides and is composed of a material having a thermal conductivity of not less than about 1.3 W/cm° C. The heat block has an external surface and a cavity therein. The cavity has a mounting surface therein to which the backside of the semiconductor substrate is adhered and through which heat from the backside of the semiconductor substrate is conducted to the external surface of the heat block. An electrically insulative encapsulant encapsulates the semiconductive substrate within the cavity of the heat block and an electrical connector is in electrical communication with the plurality of electrical circuits and extending through the encapsulant. The encapsulant can also be chosen to be a good thermal conductor.

The inventive die package preferably has a highly thermally conductive housing. The housing is a heat block, preferably formed substantially of metal, which is abutted against the die in a thermally conductive manner to facilitate the transfer of heat away from the die during use.

As described herein, the heat block is a substantially rectangular mass of metal with a cavity formed therein for receiving the die. In one embodiment, the cavity is substantially rectangular and bound on three sides by a wall and open on the fourth side. In another embodiment, the cavity is substantially rectangular and bound on all four sides by a wall. In both embodiments, the cavity is slightly larger than the perimeter of the die and the walls are arranged for close proximal contact with the perimeter.

A metal lid is provided for at least partially covering the die and for thermally conductively attaching to the die to even further facilitate heat transfer. In one embodiment, the lid has holes arranged therein to allow electrical access to the die. The holes afford footprints of the die to be shaped in a ball grid style arrangement. In another embodiment, the lid is solid and allows a lead frame to connect the die to a circuit by traversing underneath the lid.

A metal socket is provided to align the package to a circuit. The socket is designed for thermal conductive contact with the heat block when the heat block is fully seated. The socket is configured with channels for matingly receiving the lead frame of the package. In one embodiment, the socket has channels that allow the direct throughput of the lead frame to the circuit. In another embodiment, the channels are electrically coupled to the circuit by a socket pin. The socket may alternatively be configured with a plurality of heat sinks that simultaneously thermally conductively contact the socket and the heat block of the package.

The foregoing embodiments result in a novel heat dissipating package that still allows for miniaturization, saves on materials costs, allows a conforming fit with existing circuits without causing costly redesign, and utilizes the best known thermal conductors to dissipate heat instead of relying on ceramics, polymers or plastics.

These and other features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention will be rendered by reference to specific embodiments thereof which are illustrated in the appended drawings. Understanding that these drawings depict only typical embodiments of the invention and are not therefore to be considered to be limiting of its scope, the invention in its presently understood best mode for making and using the same will be described and explained with additional specificity and detail through the use of the accompanying drawings in which.

DETAILED DESCRIPTION OF THE PREFERRED EMBODIMENTS

Figure 1:
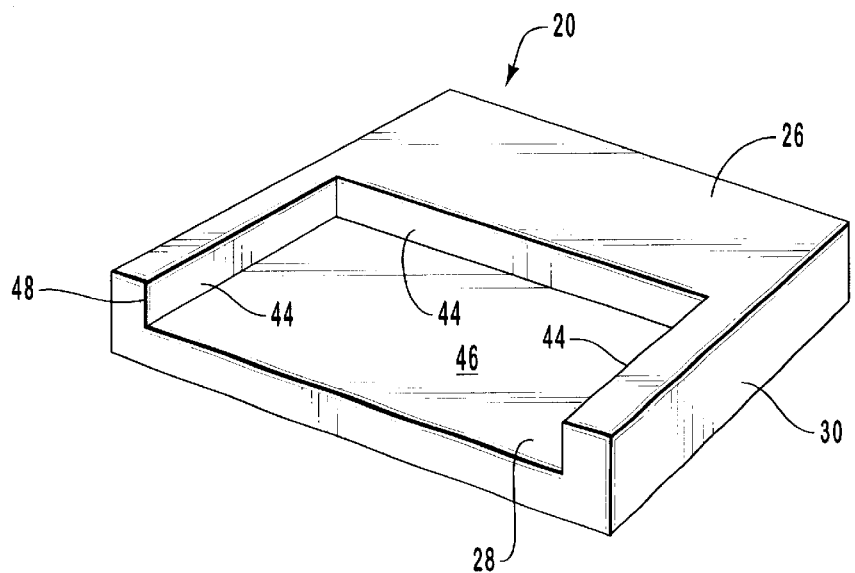
FIG. 1 is a perspective view of a heat block useful in dissipating heat in accordance with the present invention.

The present invention relates to a novel die and housing arrangement that improves heat conduction. The housing is formed substantially of a material having high thermal conductivity and is abutted against the die in a thermally conductive manner to facilitate heat transfer away from the die. As used herein, "die" means an unencased and leadless form of an electronic component part, either passive or active, discrete or integrated, includes a base substrate composed of a semiconductor material such as silicon. A die is often referred to, by those skilled in the art, by other names such as "chip," "chip die" bare die or unencapsulated IC, but will be referred to exclusively herein as "die."

As used herein, "thermal conductivity" refers to a property of a material that is useful in describing the transfer of heat through that material. Although surface area, contact area between variously arranged materials, and the particular arrangement of those materials all contribute to heat transfer, if those are held relatively constant, the higher the thermal conductivity, the greater the conduction of heat. Thermal conductivity, $\kappa$, is often expressed in (W/m° K or W/cm° C.) and varies with temperature. At 300° K, for example, substantially high thermally conductive materials include, but are not limited to: metals such as aluminum ($\kappa=237$), copper ($\kappa=401$), gold ($\kappa=317$), silver ($\kappa=429$), and tungsten ($\kappa=174$); and metal alloys such as aluminum-copper, aluminum-nickel, copper-tungsten and titanium-tungsten. For a further comprehensive discussion of thermal physical properties of various compositions, from which the foregoing values were obtained, see, e.g., F. P. Incropera, and D. P. DeWitt, *Fundamentals of Heat and Mass Transfer*, 3rd ed., Wiley & Sons, 1990. Preferably, the housing is formed from a material having a thermal conductivity not less than about that of silicon, or more preferably about 1.39 W/cm° C. at 25° C. or room temperature or 139 W/m° C. (in meters), With reference to FIGS. 1 and 2, a novel package for dissipating heat generated by a die during use is depicted generally as a package 20. In general, package 20 has an interior portion 22 and an exterior portion 24. Forming a section of both the interior and exterior portions of package 20, is a heat block 26. A first surface 28 of heat block 26 comprises a section of interior portion 22 and a second surface 30 comprises a section of the exterior portion 24.

Also forming a section of the interior portion 22 is a die 32 having a front side 34 and a back side 36. Back side 36 is adhered to first surface 28 by an adhesive having a thermal conductivity of not less than about 100 W/m° K, such as silicones or epoxys filled with Ag fillers or boron nitride (BN) fillers, or conductive die attach pastes. Attached to the front side 34 are electrical coupling devices for electrically connecting the die to a circuit during use. In particular, a bond wire 38 is connected at one end thereof to the front side 34 of the die 32 at a die connection pad or bond pad (not shown). At the other end thereof, the bond wire 38 is connected to an electrically conductive lead frame 40 (hereinafter, lead). In this embodiment, the lead 40 is conformingly shaped about an exterior of the die 32. Other connections such as tap tape can also be employed. Since the connections between the die 32 and the lead 40 are well known in the art of fabricating packages, they are not described herein in detail and are simplified in the figures. Directly abutting against the back side 36 of the die 32 along a section of the interior portion 22 of package 20, is the first surface 28 of the heat block 26.

An encapsulant 42 encapsulates the die 32, bond wire 38 and a portion of lead 40 to offer protection against various mechanical stresses and environmental problems, such as moisture. The encapsulant 42 may be hermetically or "semi-hermetically" sealed. Similar to the heat block 26, encapsulant 42 also forms a section of the interior and exterior portions of the package 20. The encapsulant 42 is well known and preferably includes a thermally conductive paste to facilitate the transfer of heat away from the die during use. The encapsulant 42 may also include plastic or molding compounds, epoxies, pure crystal structures, oxides of silicon, combinations thereof and similar other materials useful in affording protection to the die especially when mobile ions in the die are under an electrical bias and moisture is caused to flow.

Figure 2:
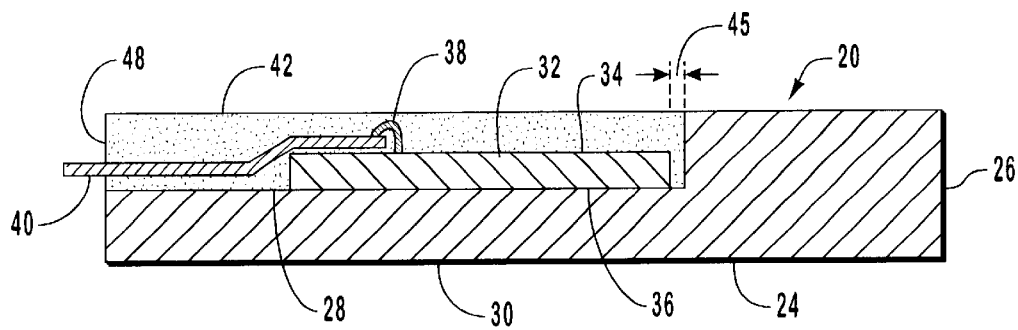
FIG. 2 is a cross sectional view of a heat dissipating package having the heat block of FIG. 1 attached with a die.

With particular reference to FIG. 1, wherein the heat block 26 of package 20 is illustrated by itself, it should be appreciated that the first surface 28 is formed by a recessed portion of a prism that has otherwise substantially rectangular shaped cross section. In particular, the first surface is defined by a wall 44, having three sides, and a cavity 46. At the terminal ends of the wall 44 is an external boundary 48 of heat block 26 beyond which the lead 40 extends to contact a circuit socket or printed circuit board (PCB) during use. The second surface 30 of heat block 26 is an external surface of the heat block 26 other than the portion thereof that is contained within cavity 46. In relation to the die 32, the heat block 26 has a large surface area and is formed substantially of materials having a high thermal conductivity as described above.

In general, the package is fabricated by inserting the die 32 into cavity 46 and attaching the die to the heat block 22. Thereafter, the die is connected to the lead 40 by wire bond 38 and encapsulated substantially within the cavity 46 by encapsulant 42. The attachment of the die 32 to the heat block 26 may consist of various embodiments.

For example, in this embodiment, cavity 46 is slightly larger than the perimeter of the die 32 along wall 44 and a gap 45 exists between the wall 44 and the die 32. In contrast, the back side 36 of die 32 is directly abutted against the first surface 28 of heat block 22. Die 32 is bonded to the wall 44 by an adhesive layer but is not adhered to first surface 28 of heat block 22. The adhesive layer, depicted as encapsulant 42 in the gap 45, is well known in the art and includes the materials described above. One particular adhesive having high thermal conductivity useful in facilitating heat transfer is a silver-based epoxy or silver loaded silicones. The adhesive may also be electrically conductive, as well as thermally conductive, so long as the die 32 is electrically grounded to avoid electrically shorting the electrical information on lead 40. As another example, the die 32 may be abutted against one, two or three sides of the walls of heat block 26 and adhered thereto where the back side 36 of the die 32 meets the first surface 28. Another example includes the roughing of the first surface 28 to form a plurality of peaks and valleys on a microscopic scale. The peaks are for contacting the die while the valleys are for filling the same with thermally conductive adhesives.

It should be appreciated, however, that when the die generates heat during use, the foregoing novel package advances the art of conducting heat away from the die. In particular, this is because: (i) the die is in direct contact with a heat block having a substantially large thermal conductivity; (ii) the die is arranged against the heat block to contact the heat block with a side of the die having a large or the largest surface area; (iii) the perimeter of the die is arranged to very closely approach the heat block along an additional three walls; (iv) near wall 44, the die is adhered to the heat block with a thermally conductive material; (v) the lead 40 is conformed about the exterior of the die proximal to the heat block to shorten the distance between the lead and the heat block for better thermal conductivity; and (vi) heat is also conducted along lead 40 and dissipated within the circuit to which the lead is attached.

Along with improving the conduction of heat away from the die during use, it should be appreciated that the foregoing embodiment advances the present state of the art for several additional reasons. These reasons include, but are not limited to: the advancement of critical applications because metal is a more effective alpha barrier in outer space applications; metal forms a less permeable barrier to moisture as compared to ceramics or plastics; since the metal is directly abutted against the die, materials costs are lessened because there are no additional layers and the corresponding expense thereof; since the heat block is both the interior and exterior of the package, materials costs are lessened because there is no additional expense for housing the heat block; since the heat block is the primary conductor of heat away from the die, and not the lead frame, the conduction of heat is not limited by the cross sectional area of the smaller lead frame; since it is not necessary to alter or reduce the thicknesses of the die, conventional manufacturing techniques may still be employed; and the use of metals and metal alloys serves to decrease the failure rate of the package because the mismatch that often occurs between the coefficients of thermal expansion for silicon and plastics is lessened by the use of silicon and metals. Finally, metallized package can be recycled. It should also be noted that a four-sided package with four walls such as 44 in FIG. 1 can also be used fully surrounding the die.

Figure 3:
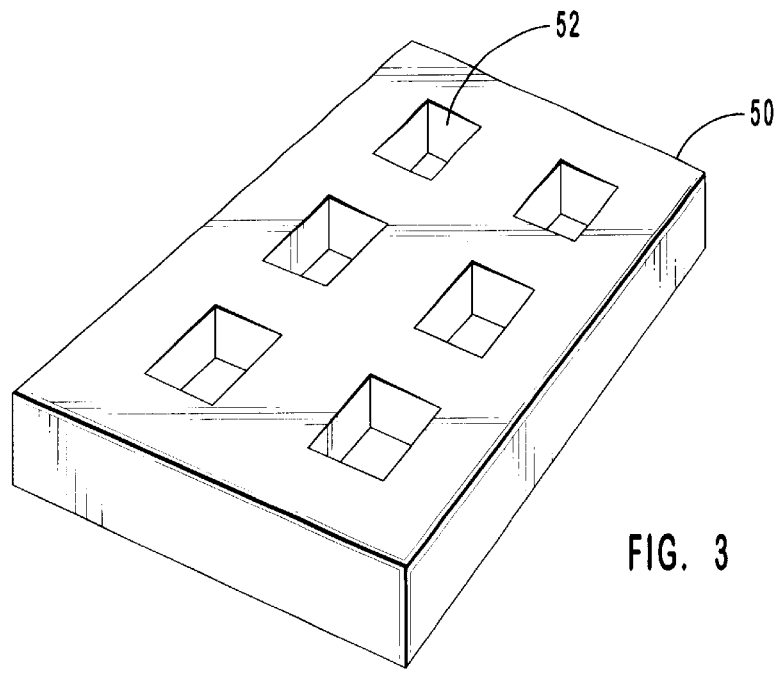
FIG. 3 is a perspective view of a heat dissipating socket useful in electrically connecting a circuit to the heat dissipating package of the present invention.

With reference to FIG. 3, a socket for facilitating the coupling of package 20 to a circuit during use is depicted generally as 50. Similar to the heat block, the socket 50 is formed substantially of a material having a substantially high thermal conductivity. To connect with package 20, the socket 50 has a plurality of channels 52 for matingly receiving the lead 40 of package 20. During use, the socket 50 is matingly aligned with a circuit (not shown) and the channels 52 allow each lead 40 to pass through a corresponding channel 52 and electrically connect to the circuit. Since both the lead 40 and the socket 50 are highly electrically conductive, the interior of channel 52 is preferably comprised of a non-electrically conductive material that prevents the electrical shorting of the lead 40 during use.

Once package 20 is fully seated against socket 50, the heat block 26 and the socket 50 both combine to increase the overall metallic surface area. This improves the conduction of heat away from the die.

Figure 4:
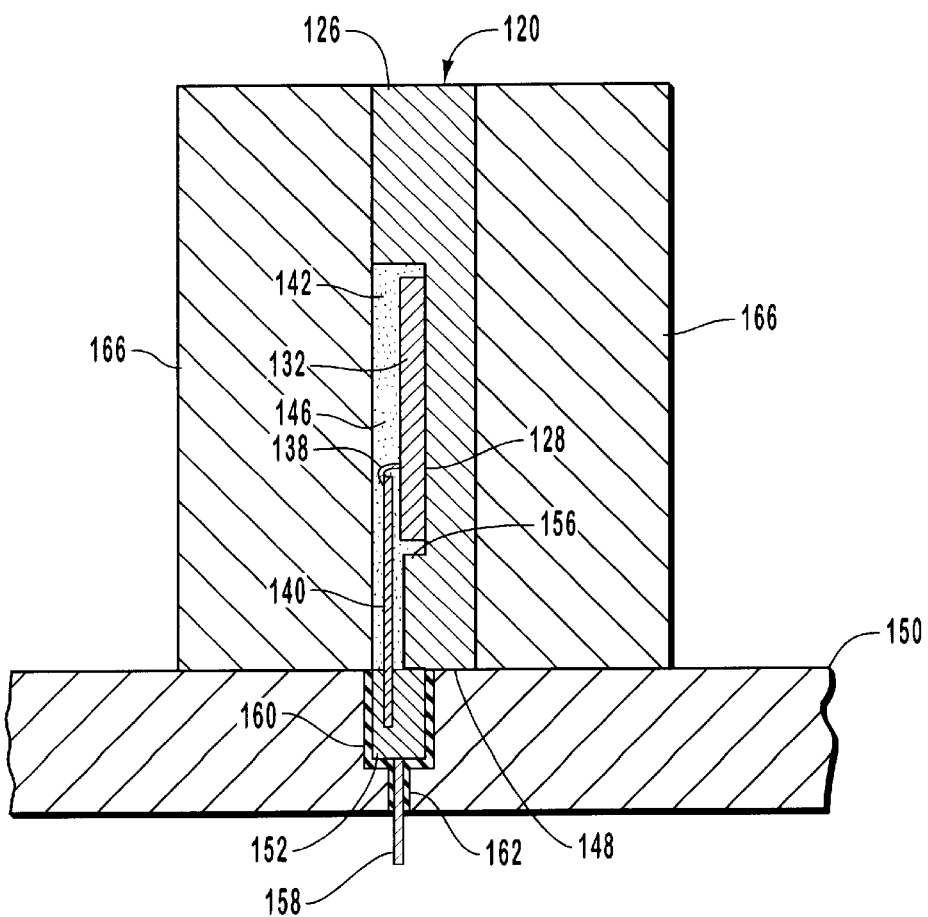
FIG. 4 is a cross sectional view of an alternative embodiment of a heat dissipating socket together with an alternative embodiment of the heat dissipating package of the present invention.

With reference to FIG. 4, an alternative embodiment of a socket 150 and a package 120 are illustrated in combination. In this embodiment, the package 120 comprises a heat block 126 formed substantially of a material having a high thermal conductivity, a die 132, a wire bond 138, a lead 140 and encapsulant 142. The difference from the previous embodiment, however, is that the lead 140 is substantially straight as it extends from within the cavity 146, near die 132, to beyond the boundary 148 of the heat block 126. In this figure, the boundary is located at the interface where the heat block 126 and the socket 150 conjoin.

Since the lead 140 does not conformingly bend about the die 132, to better facilitate heat dissipation from the die 132 through the lead 140, a ledge 156 extends away from a first surface 128 of the heat block 126 towards the lead 140. Again, in this manner, heat conduction is improved because the distance between metal components is shortened. A thermally conductive paste (not shown) may also be used between the ledge 156 and the lead 140 to even further improve heat dissipation.

During use, the lead 140 is matingly received by channel 152 of socket 150. In this embodiment, lead 140 is not throughput to the circuit but is electrically coupled to the circuit by a socket pin 158. Electrically coupling the lead 140 and socket pin 158 is an electrically conductive material 160 contained within channel 152. Alternatively, channel 152 can be composed of contacts that mate with lead 140 similar to a vice. To prevent electrical shorting with the electrically conductive socket, an electrically non-conductive barrier material 162, well known to those skilled in the art, is inserted therebetween.

During use, the package 120 is fully seated against socket 150 such that the heat block 126 and the socket 150 are touching one another. In this manner, the thermally conductive surface area is even further enlarged beyond that of package 120 alone such that heat can better be conducted away from the die.

Multiple or singular heat sinks 166 may additionally be attached to the socket to even further expand the overall thermally conductive surface area. Preferably, the heat sink 166 is a substantially solid mass of metal that is simultaneously abutted against the heat block 126 and the socket 150 to form a still larger thermal mass composed of metal or a similarly thermally conductive material.

Figure 5:
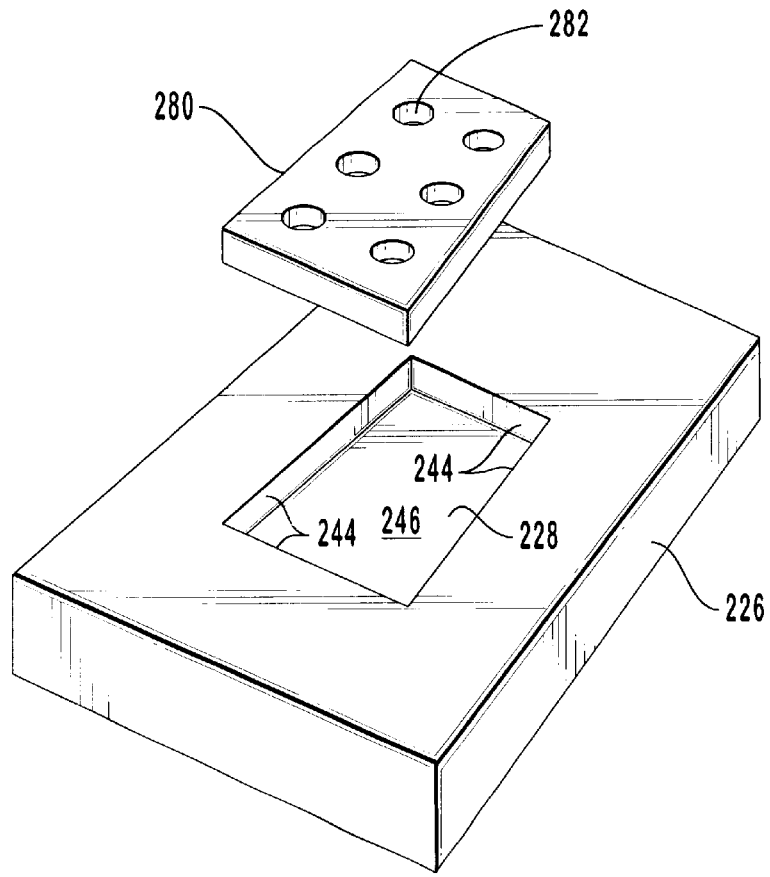
FIG. 5 is a perspective view of an alternative embodiment of a heat block useful in dissipating heat in accordance with the present invention.

With reference to FIG. 5, another alternative embodiment of the invention is depicted by a heat block 226 having a cavity 246 that is bound on all sides by a wall 244 such that the die, when placed within the cavity during use, can thermally conductively attach to the four walls as well as the first surface 228 on the bottom of the cavity 246.

A lid 280, formed substantially of a material having a high thermal conductivity, can additionally be attached to the die by covering the cavity 246 during use. This will also facilitate the conduction of heat away from the die because of the increased surface area of highly thermally conductive materials. In this embodiment, the lid 280 is configured with a plurality of holes 282 through which the die will be electrically coupled to an external circuit. These holes, even though shown as circles can take different shapes, sizes, and configurations, facilitate the extension of leads there through or facilitate connections for various other electrical contacts such as ball grid arrays. The holes 282 are preferably lined with an electrically non-conductive and thermally conductive paste to enhance thermal conductivity while preventing electrical shorts. Such pastes are well known and include polyimides, insulative epoxies and silicones, and the pastes of the variety previously described.

Figure 6:
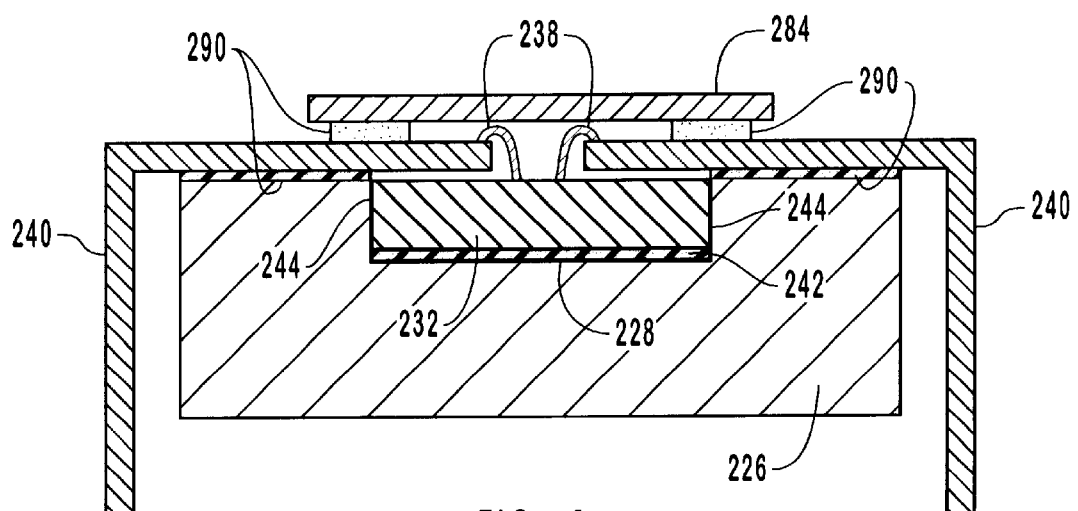
FIG. 6 is a cross sectional view of the heat block of FIG. 5 having an alternative lid embodiment for containing the die.

With reference to FIG. 6, an alternative lid embodiment 284 is depicted as covering a die 232 arranged in the heat block 226. In this embodiment, the die 232 is abutted against heat block 226 along the four side walls 244 and adhered to the first surface 228 of heat block 226 by adhesive layer 242 similar to those already described. By way of example, adhesive layer 242 can have both adhesive and electrical insulative properties. Leads 240 electrically communicate with and extend towards die 232 underneath the lid 284 by way of wire bonds 238. A thermally conductive and electrically insulative paste 290, of the type previously described, is preferably utilized between the leads 240 and the lid 284 to facilitate heat conduction while preventing electrical shorting.

Figure 7:
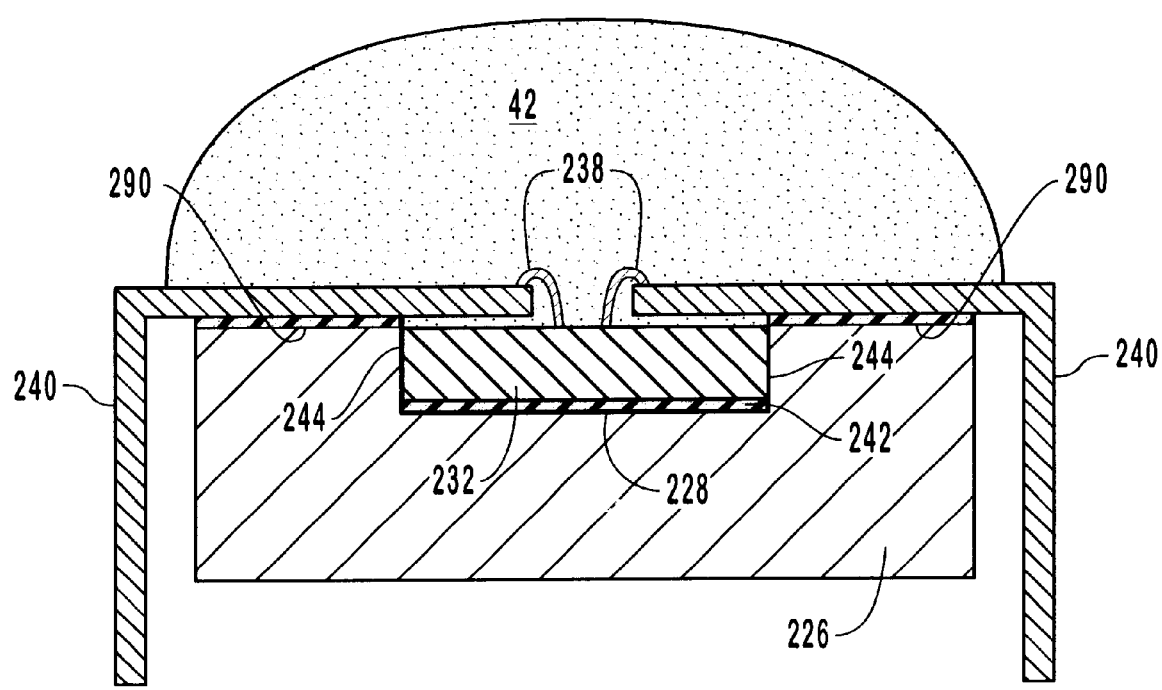
FIG. 7 is a cross sectional view of the heat block of FIG. 5 having an alternative embodiment for containing the die.

With reference to FIG. 7, die 232 within heat block 226 is arranged as illustrated in FIG. 6. Different than FIG. 6, FIG. 7 omits electrically insulative paste 290 on top of leads 240 and lid 284 is replaced by an encapsulant 42 similar to that seen in FIG. 1 so as to offer protection to leads 240, wire bonds 238, and a surface of die 232.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A heat dissipating package comprising:
    a semiconductive substrate having:
        a plurality of electrical circuits fabricated on a front circuit side thereof;
        an opposite backside thereof; and
        a plurality of side walls separating said front circuit side from said opposite backside;
    a heat block composed of a material having a thermal conductivity of not less than about 130 W/m° C., the heat block having an external surface and a cavity therein, the cavity having a plurality of side walls and a mounting surface therein to which the backside of the semiconductor substrate is adhered, said plurality of side walls of said semiconductive substrate contacting said plurality of side walls of said cavity;
    a lid situated over the external surface of the cavity so as to enclose the semiconductive substrate within the cavity of the heat block, the lid being composed of a material having a thermal conductivity of not less than about 100 W/m° C.; and
    an electrical connector in electrical communication with the plurality of electrical circuits and extending from the cavity over the external surface of the heat block.

2. A heat dissipating package according to claim 1, wherein the material of which the heat block and lid is composed is a metal or alloy thereof.

3. A heat dissipating package according to claim 1, wherein the material of which the heat block is composed and lid is composed is selected from the group consisting of aluminum, copper, gold, silver, tungsten, aluminum-copper alloy, aluminum-nickel alloy, copper-tungsten alloy, and titanium-tungsten alloy.

4. A heat dissipating package according to claim 1, wherein an electrically insulative material insulates the electrical connector from the external surface of the heat block and from the lid.

5. A heat dissipating package according to claim 1, wherein the backside of the semiconductor substrate is adhered to the mounting surface by a base layer material having both adhesive and electrical insulative properties, and further having a thermal conductivity of not less than about 100 W/m° C.

6. A heat dissipating package according to claim 5, wherein the base layer has a thermal conductivity of not less than about 100 W/m° C.

7. A heat dissipating package comprising:
a semiconductive substrate having a plurality of electrical circuits fabricated on a front circuit side thereof, having an opposite backside thereof, and having a plurality of side walls separating said front circuit side from said opposite backside;
a heat block having an external surface and a cavity therein, the cavity having a plurality of side walls and a mounting surface therein to which the backside of the semiconductor substrate is adhered, said plurality of side walls of said semiconductive substrate contacting said plurality of side walls of said cavity;
a lid situated over the external surface of the cavity so as to enclose the semiconductive substrate within the cavity of the heat block, the lid being composed of a material having a thermal conductivity of not less than about 100 W/m° C.;
an electrical connector in electrical communication with the plurality of electrical circuits and extending from the cavity over the external surface of the heat block; and
a socket having a surface therein in contact with the external surface of the heat block and having an electrically insulated channel through which the electrical connector passes, wherein the heat block, the lid and the socket are each composed of a material having a thermal conductivity of not less than about 100 W/m° C.

8. A heat dissipating package according to claim 7, wherein the material of which the heat block, lid, and socket are each composed is selected from the group consisting of aluminum, copper, gold, silver, tungsten, aluminum-copper alloy, aluminum-nickel alloy, copper-tungsten alloy, and titanium-tungsten alloy.

9. A heat dissipating package comprising:
a die including a semiconductive substrate, said semiconductive substrate having:
a plurality of electrical circuits fabricated on a front circuit side thereof;
an opposite backside thereof; and
a plurality of side walls separating said front circuit side from said opposite backside; and
a heat block
being formed of a material with a thermal conductivity of not less than about 130 W/m° C.;
having an interior portion and an exterior portion wherein said interior portion contacts both said opposite backside and said plurality of side walls;
the exterior portion of said heat block having a top exterior surface, a bottom exterior surface, and a plurality of side exterior surfaces, and the interior portion of said heat block defining a cavity for housing said die, said cavity having an opening through said top exterior surface and an opening through at least one of said plurality of side exterior surfaces.

10. A heat dissipating package according to claim 7, further comprising an encapsulant, in contact with the die and the heat block, for conducting heat away from said die and for encapsulating said die within said interior portion of said heat block.

11. A heat dissipating package according to claim 9, further comprising a lid for at least partially covering said die to facilitate conduction of heat away from said die, said lid being composed of a material having a thermal conductivity of not less than about 100 W/m°C., wherein said opening through at least one of said plurality of side exterior surfaces is filled, so that each one of said plurality of exterior surfaces is a continuous surface within the perimeter of each one of said plurality of exterior surfaces.

12. A conductive package comprising:
a die including a semiconductive substrate, said semiconductive substrate having:
a plurality of electrical circuits fabricated on a front circuit side thereof;
an opposite backside thereof; and
a plurality of side walls separating said front circuit side from said opposite backside;
an electrically conductive lead frame attached to said die and in electrical communication with the plurality of circuits; and
a heat block for conducting heat generated by said die away from said die, the heat block being formed of metal and having a cavity formed by a wall, wherein said plurality of side walls of said semiconductive substrate contacts the wall forming the cavity;
the heat block further having a top exterior surface, a bottom exterior surface, and a plurality of side exterior surfaces, and said cavity having an opening through said top exterior surface and an opening through at least one of said plurality of side exterior surfaces.

13. A conductive package according to claim 12, further comprising an encapsulant for encapsulating said die and a portion of said electrically conductive lead frame.

14. A conductive package according to claim 12, further comprising an electrically conductive adhesive layer for attaching said heat block to said die.

15. A conductive package according to claim 12, further comprising an electrically insulating adhesive layer for attaching said heat block to said die.

16. A conductive package according to claim 12, wherein a wire bond is attached to said electrically conductive lead frame and is attached to said die, wherein the electrically conductive lead frame extends away from said wire bond die in a straight manner.

17. A conductive package according to claim 12, further comprising an encapsulant in contact with the electrically conductive lead frame, wherein the encapsulant electrically insulates the electrically conductive lead frame from the heat block.

18. A conductive package according to claim 12, wherein a portion of said electrically conductive lead frame is conformingly shaped about an exterior of said die.

19. A conductive package for dissipating heat comprising:
an interior and an exterior portion;
a die including a semiconductive substrate, said semiconductive substrate having:
a plurality of electrical circuits fabricated on a front circuit side thereof;
an opposite backside thereof; and
a plurality of side walls separating said front circuit side from said opposite backside;
an electrically conductive lead frame attached to said die and in electrical communication with the plurality of circuits;
a heat block formed of a material having a thermal conductivity of not less than about 130 W/m° C. and having a cavity formed by a wall, wherein said plurality of side walls of said semiconductive substrate contacts the wall forming the cavity; the heat block further having a top exterior surface, a bottom exterior surface, and a plurality of side exterior surfaces, and said cavity having an opening through said top exterior surface and an opening through at least one of said plurality of side exterior surfaces; and a socket being composed of a material having a thermal conductivity of not less than about 130 W/m° C. for conducting heat away from said die, said socket having a channel for matingly receiving said electrically conductive lead frame so that said electrically conductive lead frame can be electrically coupled to an external electrical circuit.

20. The conductive package according to claim 19, wherein:

said socket further comprises a socket pin and said channel is electrically coupled to said socket pin.

21. The conductive package according to claim 19, further comprising a heat sink formed of a material having a thermal conductivity of not less than about 130 W/m° C. for facilitating the conduction of heat away from said die, said heat sink being attached to said socket.

22. The conductive package according to claim 21, wherein said heat sink is attached to said socket to abut against said heat block to facilitate conduction of heat away from said die.

23. A heat dissipating package according to claim 19, wherein the material of which the heat block and the socket are each composed is selected from the group consisting of aluminum, copper, gold, silver, tungsten, aluminum-copper alloy, aluminum-nickel alloy, copper-tungsten alloy, and titanium-tungsten alloy.

24. A heat dissipating package having an interior and an exterior portion, comprising:

a die including a semiconductive substrate, said semiconductive substrate having:
  a plurality of electrical circuits fabricated on a front side;
  a back side; and
  a plurality of side walls separating said front side from said back side;

an electrically conductive lead frame attached to said front side of said semiconductive substrate and in electrical communication with said plurality of circuits;

a heat block having:
  a first surface and a second surface, said first surface forming a section of said interior portion, said second surface forming a section of said exterior portion, said first surface contacting:
    said back side of said semiconductive substrate; and
    said plurality of side walls of said semiconductive substrate for conducting heat away from said die towards said second surface; and
  a plurality of walls defining both a cavity and at least a lateral boundary of said heat block, said electrically conductive lead frame extending from within said cavity beyond said lateral boundary; and an encapsulant encapsulating said die and a portion of said electrically conductive lead frame.

25. A package according to claim 24, further comprising a lid formed substantially of metal and at least partially covering said die.

26. A package according to claim 24, further comprising an adhesive layer for attaching said heat block to said die.

27. A package according to claim 26, wherein said adhesive layer is a silver loaded glass.

28. A heat dissipating package according to claim 24, wherein the material of which the heat block is composed is a metal or alloy thereof.

29. A heat dissipating package according to claim 24, wherein the material of which the heat block is composed is electrically conductive.

30. A heat dissipating package according to claim 19, wherein the material of which the heat block is composed and the socket is composed is a metal or alloy thereof.

31. A heat dissipating package according to claim 19, wherein the material of which the heat block is composed is electrically conductive.

32. A heat dissipating package according to claim 12, wherein the material of which the heat block is composed is a metal or alloy thereof.

33. A heat dissipating package according to claim 12, wherein the material of which the heat block is composed is electrically conductive.

34. A heat dissipating package according to claim 9, wherein the material of which the heat block is composed is a metal alloy thereof.

35. A heat dissipating package according to claim 9, wherein the material of which the heat block is composed is electrically conductive.

36. A heat dissipating package according to claim 7, wherein each of the heat block, the lid, and the socket is composed of a metal or alloy thereof.

37. A heat dissipating package according to claim 7, wherein each of the heat block, the lid, and the socket is electrically conductive.

38. A heat dissipating package according to claim 1, wherein the material of which the heat block is composed is electrically conductive.

* * * * *

UNITED STATES PATENT AND TRADEMARK OFFICE
CERTIFICATE OF CORRECTION

PATENT NO. : 6,404,048 B2  Page 1 of 1
DATED : June 11, 2002
INVENTOR(S) : Salman Akram It is certified that error appears in the above-identified patent and that said Letters Patent is hereby corrected as shown below:

Title page,
Item [56], U.S. PATENT DOCUMENTS, US Patent "5,317,436", change "Sprtzer" to -- Spitzer --
Item [56], U.S. PATENT DOCUMENTS, US Patent "5,629,835", change "Mahnliker" to -- Mahulikar --

Column 4,
Line 44, change "meters)," to -- meters). --

Column 9,
Line 57, after "claim" change "7" to -- 9 --

Signed and Sealed this

Twenty-eighth Day of January, 2003

JAMES E. ROGAN
*Director of the United States Patent and Trademark Office*